United States Patent [19]

Keeth et al.

[11] Patent Number: 6,104,209
[45] Date of Patent: Aug. 15, 2000

[54] LOW SKEW DIFFERENTIAL RECEIVER WITH DISABLE FEATURE

[75] Inventors: Brent Keeth, Boise; Russel J. Baker, Meridian, both of Id.

[73] Assignee: Micron Technology, Inc., Boise, Id.

[21] Appl. No.: 09/140,857

[22] Filed: Aug. 27, 1998

[51] Int. Cl.⁷ .................... H03K 19/0185; H03K 19/003
[52] U.S. Cl. ................. 326/83; 326/33; 326/58; 326/86; 327/112; 327/262; 327/563
[58] Field of Search .................. 326/21, 31, 33, 326/34, 58, 57, 83, 86, 87, 98, 62, 68, 115, 121; 327/108, 109, 112, 530, 262, 65, 292, 562, 563, 205

[56] References Cited

U.S. PATENT DOCUMENTS

| | | | |
|---|---|---|---|
| 4,459,660 | 7/1984 | Bellay et al. | 364/200 |
| 4,689,494 | 8/1987 | Chen et al. | 307/202.1 |
| 4,714,839 | 12/1987 | Chung | 307/441 |
| 4,720,817 | 1/1988 | Childers | 365/200 |
| 4,801,992 | 1/1989 | Golubic | 357/40 |
| 4,843,188 | 6/1989 | Patterson et al. | 174/52.4 |
| 4,958,088 | 9/1990 | Farah-Bakhsh et al. | 326/24 |
| 5,097,157 | 3/1992 | Jaffe et al. | 307/530 |
| 5,164,619 | 11/1992 | Luebs | 327/297 |
| 5,216,297 | 6/1993 | Proebsting | 326/73 |
| 5,278,460 | 1/1994 | Casper | 326/62 |
| 5,311,081 | 5/1994 | Donaldson et al. | 326/62 |
| 5,361,002 | 11/1994 | Casper | 327/530 |
| 5,389,834 | 2/1995 | Kinugasa et al. | 326/21 |
| 5,412,593 | 5/1995 | Magel et al. | 365/96 |
| 5,422,529 | 6/1995 | Lee | 327/536 |
| 5,432,823 | 7/1995 | Gasbarro et al. | 375/356 |
| 5,442,589 | 8/1995 | Kowalski | 365/225.7 |
| 5,448,187 | 9/1995 | Kowalski | 326/81 |
| 5,451,898 | 9/1995 | Johnson | 327/563 |
| 5,465,060 | 11/1995 | Pelella | 327/51 |
| 5,488,321 | 1/1996 | Johnson | 327/66 |
| 5,495,436 | 2/1996 | Callahan | 365/96 |
| 5,526,312 | 6/1996 | Eltoukhy | 365/201 |
| 5,539,333 | 7/1996 | Cao et al. | 326/63 |

(List continued on next page.)

FOREIGN PATENT DOCUMENTS

WO 95/22064  8/1995  WIPO .

OTHER PUBLICATIONS

Chapman, J. et al., "A Low–Cost High–Performance CMOS Timing Vernier for ATE", IEEE International Test Conference, Paper 21.2, 1995, pp. 459–468.

Descriptive literature entitled, "400MHz SLDRAM, 4M X 16 SLDRAM Pipelined, Eight Bank, 2.5 V Operation," SLDRAM Consortium Advance Sheet, published throughout the United States, pp. 1–22.

"Drafted Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Michael Tokar
*Assistant Examiner*—Richard Roseen
*Attorney, Agent, or Firm*—Seed and Berry LLP

[57] ABSTRACT

A differential clock receiver for a SynchLink-type Synchronous Dynamic Random Access Memory (SLDRAM) includes a differential amplifier with a novel method for biasing its NMOS and PMOS current sources. A differential clock received and amplified by the differential amplifier switches a set of multiplexers, which respond by outputting a differential output clock. The multiplexers can be "disabled" by an inactive enable signal so they output a constant "0" level for the differential output clock. This disabling feature of the differential clock receiver is particularly useful with the intermittent data clocks found in SLDRAMs. Also, the novel biasing method for the current sources of the differential amplifier gives the clock receiver very low skew.

13 Claims, 3 Drawing Sheets

U.S. PATENT DOCUMENTS

| | | | |
|---|---|---|---|
| 5,570,042 | 10/1996 | Ma | 326/63 |
| 5,572,458 | 11/1996 | Smith et al. | 365/96 |
| 5,572,476 | 11/1996 | Eltoukhy | 365/210 |
| 5,578,941 | 11/1996 | Sher et al. | 326/34 |
| 5,621,340 | 4/1997 | Lee et al. | 327/65 |
| 5,625,805 | 4/1997 | Fenwick et al. | 395/558 |
| 5,663,915 | 9/1997 | Mobley | 365/208 |
| 5,666,067 | 9/1997 | Sher et al. | 326/34 |
| 5,706,292 | 1/1998 | Merritt | 371/10.2 |
| 5,734,617 | 3/1998 | Zheng | 365/225.7 |
| 5,781,486 | 7/1998 | Merritt | 365/201 |
| 5,898,297 | 4/1999 | Bosnyak et al. | 323/315 |
| 5,915,105 | 6/1999 | Farmwald et al. | 395/309 |

LOW SKEW DIFFERENTIAL RECEIVER WITH DISABLE FEATURE

CROSS-REFERENCE TO RELATED APPLICATIONS

This patent application is a continuation-in-part of a related patent application entitled "Low Skew Differential Signal Converter," filed Feb. 11, 1997, and having Ser. No. 08/798,228, now U.S. Pat. No. 5,852,378 and is also a continuation-in-part of a related patent application entitled "Fully Differential Amplifier," filed Dec. 23, 1997, and having Ser. No. 08/993,837. Both of these related applications are hereby incorporated into this patent application by reference.

BACKGROUND OF THE INVENTION

1. Technical Field

This invention relates in general to semiconductor devices and, more specifically, to receivers and other input buffers having differential inputs and outputs, low skew, and a disable feature. Such receivers are particularly useful in synchronous semiconductor memories.

2. Related Art

Most Dynamic Random Access Memories (DRAMs) have an asynchronous timing relationship with other electronic devices they interact with. In recent years, however, synchronous DRAMs have become popular because they provide faster memory access than asynchronous DRAMs.

One type of synchronous DRAM, known as a "SynchLink" DRAM (SLDRAM), is shown in FIG. 1. The non-prior art SLDRAM 10 receives command packets containing command and address signals from a memory controller 12 via a 10-bit-wide command link, and these command packets are latched into the SLDRAM 10 in response to a differential command clock (CCLK, CCLK*). Similarly, the SLDRAM 10 and memory controller 12 share write and read data via a bidirectional, 16-bit-wide datalink, and this data is latched into or out of the SLDRAM 10 in response to one of two differential data clocks (DCLK0, DCLK0*) and (DCLK1, DCLK1*). The particular data clock (DCLK0, DCLK0*) or (DCLK1, DCLK1*) in use at any given time is determined by command signals from the memory controller 12.

Within the SLDRAM 10, a delay locked-loop (DLL) 14 generates a delayed command clock CCLKD in response to the command clock (CCLK, CCLK*) and control signals 16 received from control logic 18. The delayed command clock CCLKD, in turn, causes a command latch 20 to latch in a command packet from the command link. The command packet is then made available to the control logic 18, which responds by directing read/write (R/W) circuitry 22 to access a memory array 24 of the SLDRAM 10.

Also, a delay circuit 26 generates a delayed write data clock DCLKW and a delayed read data clock DCLKR in response to control signals 28 from the control logic 18 and the data clock (DCLK0, DCLK0*) or (DCLK1, DCLK1*) selected by the memory controller 12. In a write operation, the delayed write data clock DCLKW causes a data latch 30 to latch in write data from the datalink, which is then made available to the R/W circuitry 22 for storage in the memory array 24. In a read operation, the delayed read data clock DCLKR causes the data latch 30 to latch in read data from the R/W circuitry 22 and memory array 24, which is then transferred over the datalink to the memory controller 12.

Each of the differential clocks (CCLK, CCLK*), (DCLK0, DCLK0*) and (DCLK1, DCLK1*) is typically buffered by a differential receiver within the SLDRAM 10. For example, as shown in FIG. 2, the delay circuit 26 generally includes a differential receiver 34 that buffers the differential data clock (DCLK0, DCLK0*) and outputs a corresponding differential data clock (DCLK0OUT, DCLK0OUT*) suitable for internal use by the SLDRAM 10 (FIG. 1).

Proper operation of the SLDRAM 10 (FIG. 1) generally requires that the differential receiver 34 exhibit low timing skew. Also, because the data clock (DCLK0, DCLK0*) is only operative intermittently (recall that the memory controller 12 (FIG. 1) periodically selects one or the other of the data clocks (DCLK0, DCLK0*) and (DCLK1, DCLK1*) for current use), it is desirable for the differential receiver 34 to have a disable feature which causes it to output a "0" state on its outputs DCLKOUT and DCLKOUT* when the other data clock (DCLK1, DCLK1*) (FIG. 1) is the operative data clock. Of course, the differential receiver 34 does not require a disable feature if it is used to buffer the command clock (CCLK, CCLK*) (FIG. 1) rather than the data clock (DCLK0, DCLK0*).

Various input buffers, receivers, and low skew circuit architectures are known in the art, including, for example, those described in U.S. Pat. Nos. 4,958,088, 5,164,619, 5,278,460, 5,311,081, 5,361,002, 5,432,823, 5,465,060, 5,539,333, 5,570,042, 5,578,941, 5,625,805, and 5,666,067. But none of these satisfy the requirements of a receiver for the SLDRAM described above.

Therefore, there is a need in the art for a receiver having differential inputs and outputs that exhibits low timing skew and, preferably, has a disable feature for use with intermittent data clocks. Such a receiver would be particularly useful with the SLDRAM described above and with other SDRAMs.

SUMMARY OF THE INVENTION

In one embodiment of this invention, an input buffer, such as a clock receiver, includes a differential amplifier. First and second inverter circuits in the differential amplifier have control nodes for receiving respective true and complementary input signals, such as a differential input clock signal, and have output nodes for outputting respective true and complementary amplified signals. Third and fourth inverter circuits of the differential amplifier have control nodes for receiving the respective true and complementary input signals, and have mutually coupled output nodes. A first current source has a supply node for receiving a supply voltage, a control node coupled to the output nodes of the third and fourth inverter circuits, and an output node coupled to supply nodes of the first, second, third, and fourth inverter circuits. Also, a second current source has a reference node for receiving a reference voltage, a control node coupled to the output nodes of the third and fourth inverter circuits, and an input node coupled to reference nodes of the first, second, third, and fourth inverter circuits. The input buffer also includes switching circuitry coupled to the differential amplifier for outputting true and complementary output signals in response to the true and complementary amplified signals.

The unique structure of the inventive input buffer gives it very low skew. Also, a disable feature may be provided in the switching circuitry to disable the output signals, which is convenient for use when buffering intermittent data clocks found in SynchLink-type Synchronous Dynamic Random Access Memories (SLDRAMs).

Other embodiments of this invention incorporate the input buffer described above into a DRAM, a Synchronous DRAM (SDRAM), an SLDRAM, a delay circuit, an electronic system, and a semiconductor substrate, such as a semiconductor wafer.

In still another embodiment of this invention, a differential input signal is buffered using a differential amplifier and switching circuitry, such as multiplexers. The differential amplifier includes first, second, third and fourth inverter circuits, a first current source having a control node coupled to output nodes of the third and fourth inverter circuits and an output node coupled to supply nodes of the first, second, third, and fourth inverter circuits, and a second current source having a control node coupled to the output nodes of the third and fourth inverter circuits and an input node coupled to reference nodes of the first, second, third, and fourth inverter circuits. To bias the differential amplifier, a supply voltage is applied to a supply node of the first current source, and a reference voltage is applied to a reference node of the second current source. Then, the differential input signal is applied to control nodes of the inverter circuits to generate a differential amplified signal at output nodes of the first and second inverter circuits. A differential output signal is then selectively output from the switching circuitry in response to the differential amplified signal.

DETAILED DESCRIPTION OF THE ILLUSTRATED EMBODIMENTS

Figure 3:
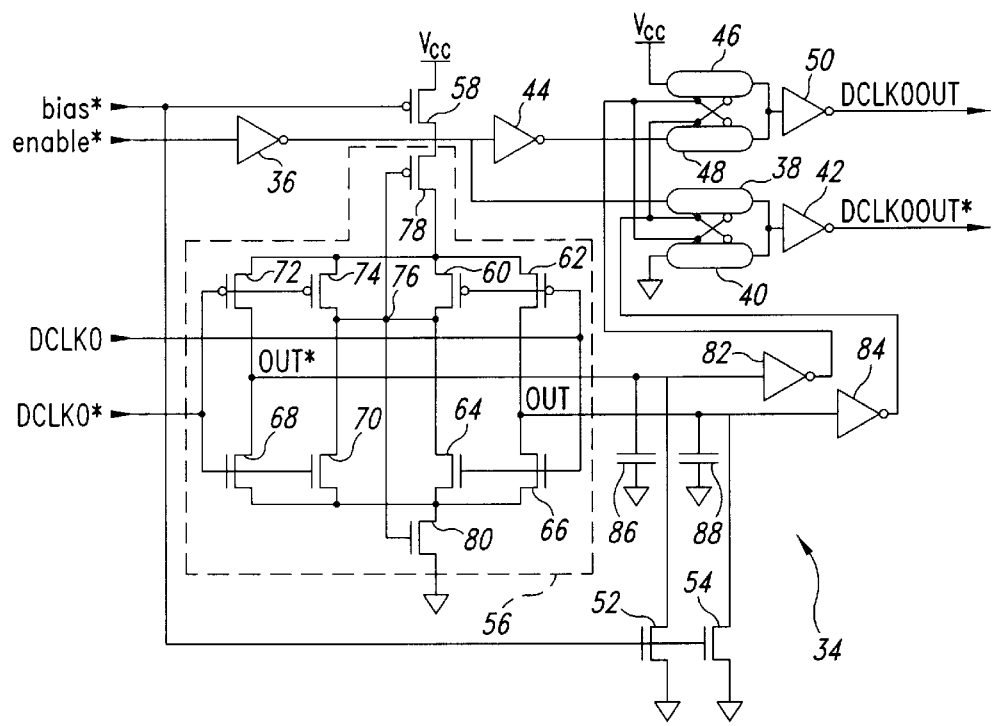
FIG. 3 is a circuit diagram of a differential receiver in accordance with this invention for use as shown in FIG. 2.

As shown in FIG. 3, in a start-up mode of the differential receiver 34, an inactive (i.e. high) enable signal ENABLE* causes an inverter 36 to output a low which, in turn, causes a pair of multiplexers or "muxes" 38 and 40 to output a low, thereby causing an inverter 42 to output an inactive (i.e. high) data clock DCLK0OUT*. Also, the low output of the inverter 36 causes an inverter 44 to output a high which, in turn, causes a pair of muxes 46 and 48 to output a high, thereby causing an inverter 50 to output an inactive (i.e. low) data clock DCLK0OUT. At the same time, an inactive (i.e. high) bias signal BIAS* turns on a pair of NMOS transistors 52 and 54, thereby grounding true and complementary output nodes OUT and OUT* of a differential amplifier 56.

In a disabled mode, an active (i.e. low) bias signal BIAS* turns off the NMOS transistors 52 and 54 and turns on a PMOS current-source transistor 58, thereby supplying current to the differential amplifier 56. With a supply of current, the output nodes OUT and OUT* begin to follow the differential data clock (DCLK0, DCLK0*).

For example, during a preamble period of the disabled mode in which the differential data clock (DCLK0, DCLK0*) is in an inactive or "0" state, an inactive (i.e. low) data clock DCLK0 activates PMOS transistors 60 and 62 and deactivates NMOS transistors 64 and 66. At the same time, an inactive (i.e. high) data clock DCLK0* activates NMOS transistors 68 and 70 while deactivating PMOS transistors 72 and 74. Concurrently, a self-correcting bias point 76 settles to a mid-point voltage level at which the current through a partially activated PMOS current-source transistor 78 matches the current through a partially activated NMOS transistor 80.

By the phrase "self-correcting," it is meant that any increase in voltage on the bias point 76 tends to turn the NMOS transistor 80 on more and the PMOS transistor 78 off more, which, in turn, tends to decrease the voltage on the bias point 76 by pulling it toward ground through the transistors 70 and 80. Similarly, any decrease in voltage on the bias point 76 tends to turn the PMOS transistor 78 on more and the NMOS transistor 80 off more, which, in turn, tends to increase the voltage on the bias point 76 by pulling it toward the supply voltage $V_{CC}$ through the transistors 60, 78, and 58. With the NMOS transistor 68 on, the complementary output node OUT* is pulled low, and with the PMOS transistor 62 on, the true output node OUT is pulled high.

The low output from the complementary output node OUT* causes an inverter 82 to output a high, and the high output by the true output node OUT causes an inverter 84 to output a low. However, in the disabled mode the inactive enable signal ENABLE* continues to cause the muxes 38, 40, 46, and 48 and the inverters 42 and 50 to output an inactive differential data clock (DCLK0OUT, DCLK0OUT*) no matter what the output nodes OUT and OUT* output.

In an enabled mode, an active (i.e. low) enable signal ENABLE* causes the inverter 36 to output a high, thereby providing a high voltage to the mux 38. Also, the high output from the inverter 36 causes the inverter 44 to output a low, thereby providing a low voltage to the mux 48.

The differential data clock (DCLK0, DCLK0*) then begins running as it is selected by the memory controller 12 (FIG. 1) for current use. When the differential data clock (DCLK0, DCLK0*) is in a "1" state, a high data clock DCLK0 turns off PMOS transistors 60 and 62 and turns on NMOS transistors 64 and 66, thereby pulling the true output node OUT low, while a low data clock DCLK0* turns on PMOS transistors 72 and 74 and turns off NMOS transistors 68 and 70, thereby pulling the complementary output node OUT* high.

The low output from the true output node OUT causes the inverter 84 to output a high, while the high output from the complementary output node OUT* causes the inverter 82 to output a low. These outputs then turn on the muxes 38 and 48 and turn off the muxes 40 and 46. As a result, the mux 38 passes a high to the inverter 42, which then outputs a low data clock DCLK0OUT*, and the mux 48 passes a low to the inverter 50, which then outputs a high data clock DCLK0OUT. It can be seen, of course, that a differential data clock (DCLK0, DCLK0*) in a "0" state would have the opposite effect and would cause the data clock DCLK0OUT to be low and the data clock DCLK0OUT* to be high. When it is time to switch from using the data clock (DCLK0, DCLK0*) (FIG. 1) to using the data clock (DCLK1, DCLK1*) (FIG. 1), then an inactive enable signal ENABLE* causes the receiver 34 to reenter the disabled mode and a similar receiver (not shown) can be enabled for use with the data clock (DCLK1, DCLK1*).

This invention thus provides a receiver having differential inputs and outputs and a disable feature useful with intermittent data clocks found in the SynchLink DRAM (SLDRAM). Also, the inventive receiver has very low skew because of its balanced differential amplifier design. Corrective capacitors 86 and 88 attached to the complementary and true output nodes OUT* and OUT of the differential amplifier 56 aid in balancing the NMOS and PMOS capacitances at the output nodes OUT and OUT*, thereby helping to minimize skew.

Those of skill in the technical field of this invention will understand that it is applicable to a wide variety of semiconductor devices, and is not restricted only to Synchronous DRAMs (SDRAMs), such as SLDRAMs. The principles of the invention may be applied, for example, in providing a wide variety of differential input buffers. Similarly, it should be understood that the invention does not typically need the disable feature when it is used with a command clock (CCLK, CCLK*) (see FIG. 1), but that the disable feature is of great use when the invention is used with an intermittent data clock.

Also, it should be understood that the transistor pairs 68 and 72, 70 and 74, 60 and 64, and 62 and 66 may be referred to as "inverter circuits," that the transistors 78 and 80 may be referred to as "current sources," and that the muxes 38, 40, 46, and 48 may be referred to as "switching circuitry."

Figure 1:
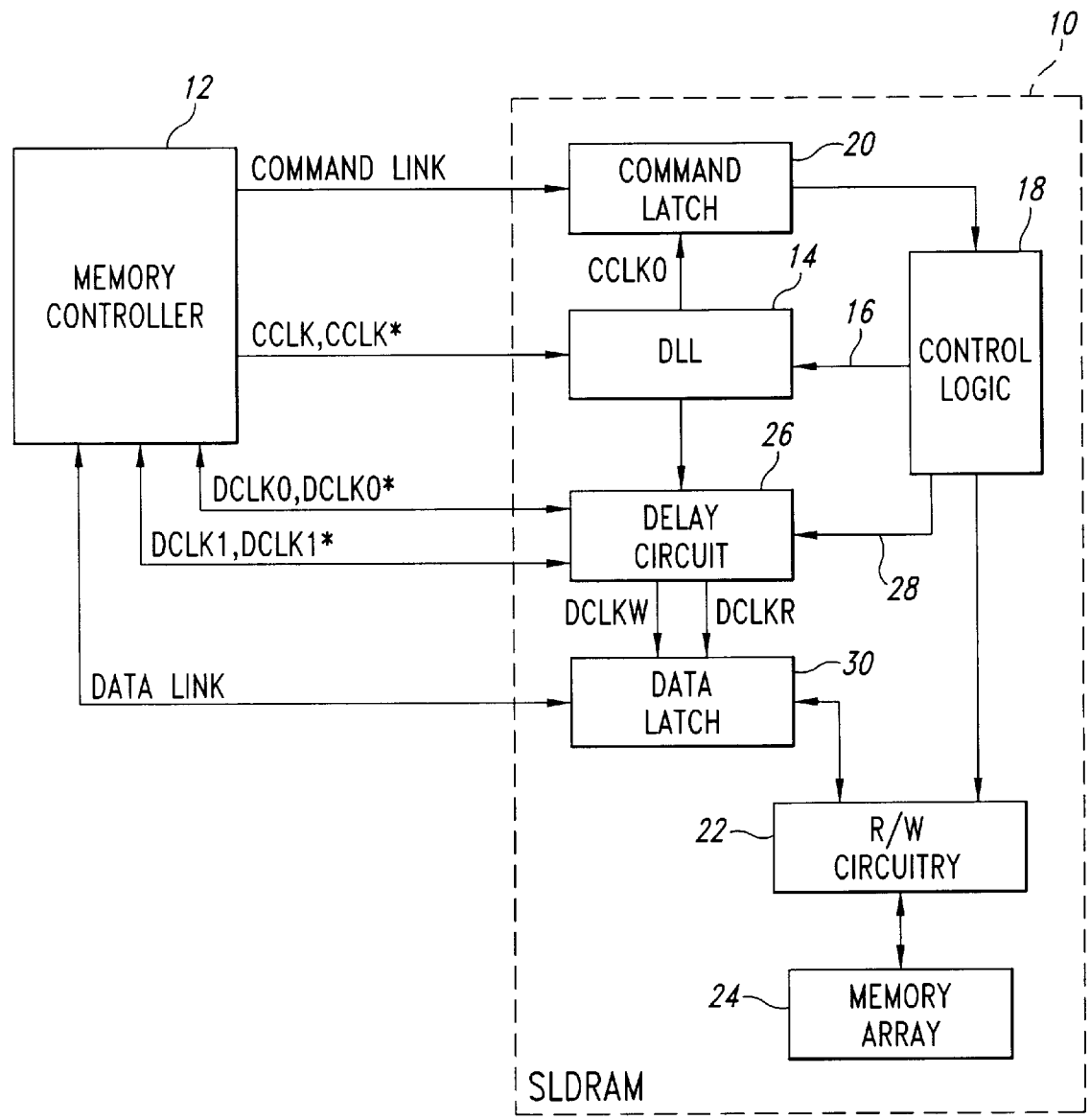
FIG. 1 is a block diagram of a "SynchLink" Dynamic Random Access Memory (SLDRAM) and memory controller in accordance with related (not prior) art.
Figure 2:
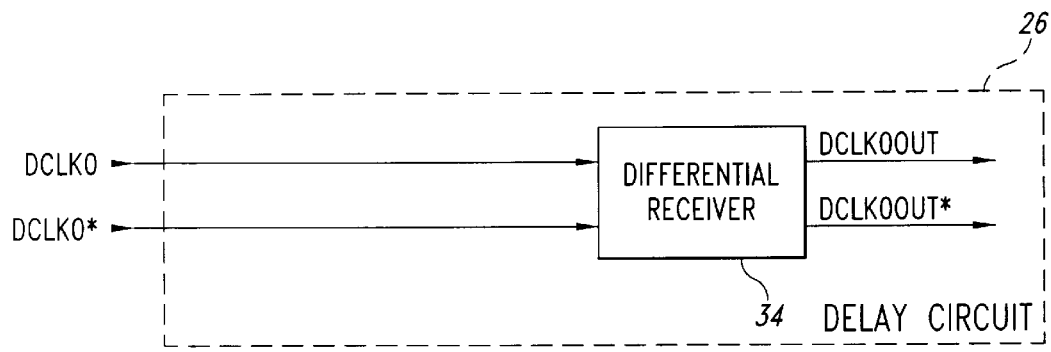
FIG. 2 is a more detailed view of a differential receiver in the SLDRAM of FIG. 1.
Figure 4:
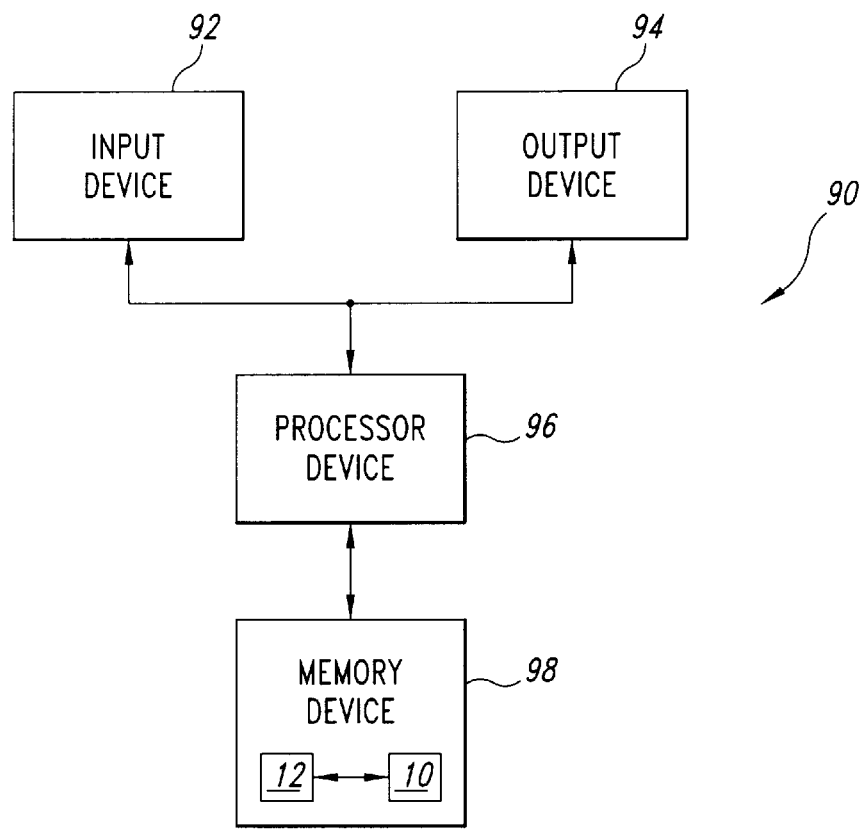
FIG. 4 is a block diagram of an electronic system incorporating the SLDRAM of FIG. 1, which includes the differential receiver of FIG. 3.

As shown in FIG. 4, an electronic system 90 includes an input device 92, an output device 94, a processor device 96, and a memory device 98 which includes the memory controller 12 and SLDRAM 10 of FIG. 1, incorporating the receiver 34 of FIG. 3. Of course, it will be understood that the memory controller 12 and SLDRAM 10 may be incorporated into any one of the input, output, and processor devices 92, 94, and 96 instead.

Figure 5:
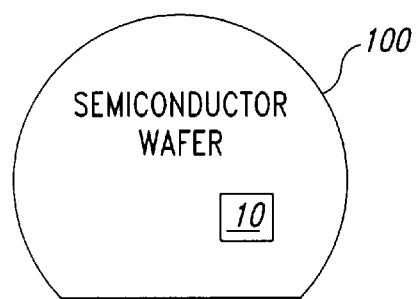
FIG. 5 is a diagram of a semiconductor wafer on which the SLDRAM of FIG. 1, including the differential receiver of FIG. 3, is fabricated.

As shown in FIG. 5, the SLDRAM 10 of FIG. 1, incorporating the receiver 34 of FIG. 3, is fabricated on the surface of a semiconductor wafer 100. It should be understood, though, that other substrates will work for purposes of this invention including, for example, Silicon-on-Sapphire (SOS) substrates, Silicon-on-Insulator (SOI) substrates, and Silicon-on-Glass (SOG) substrates.

Although the present invention has been described with reference to a particular embodiment, the invention is not limited to this embodiment. Rather, the invention is limited only by the appended claims, which include within their scope all equivalent devices and methods that operate according to the principles of the invention as described.

We claim:

1. An input buffer comprising:
 a differential amplifier including:
  first and second inverter circuits having control nodes for receiving respective true and complementary input signals and having output nodes for outputting respective true and complementary amplified signals;
  third and fourth inverter circuits having control nodes for receiving the respective true and complementary input signals and having mutually coupled output nodes;
  a first current source having a supply node for receiving a supply voltage, a control node coupled to the output nodes of the third and fourth inverter circuits, and an output node coupled to supply nodes of the first, second, third, and fourth inverter circuits; and
  a second current source having a reference node for receiving a reference voltage, a control node coupled to the output nodes of the third and fourth inverter circuits, and an input node coupled to reference nodes of the first, second, third, and fourth inverter circuits; and
 switching circuitry coupled to the differential amplifier for outputting true and complementary output signals in response to the true and complementary amplified signals.

2. The input buffer of claim 1 wherein the switching circuitry has a disable feature.

3. The input buffer of claim 1 wherein each of the first, second, third, and fourth inverter circuits comprises:
 a PMOS transistor having a gate coupled to the inverter circuit control node, a source coupled to the inverter circuit supply node, and a drain coupled to the inverter circuit output node; and
 an NMOS transistor having a gate coupled to the inverter circuit control node, a source coupled to the inverter circuit reference node, and a drain coupled to the drain of the PMOS transistor and the inverter circuit output node.

4. The input buffer of claim 1 wherein the first and second current sources comprise a PMOS transistor and an NMOS transistor, respectively, the PMOS transistor having a source coupled to the first current source supply node, a gate coupled to the first current source control node, and a drain coupled to the first current source output node, the NMOS transistor having a source coupled to the second current source reference node, a gate coupled to the second current source control node, and a drain coupled to the second current source input node.

5. The input buffer of claim 1 wherein the switching circuitry includes a plurality of multiplexers.

6. The input buffer of claim 1 wherein the true and complimentary input signals comprise true and complimentary input clock signals, respectively, and wherein the true and complimentary output signals comprise true and complimentary output clock signals, respectively.

7. A semiconductor substrate on which a semiconductor device is fabricated, the semiconductor device including an input buffer comprising:
 a differential amplifier including:
  first and second inverter circuits having control nodes for receiving respective true and complementary input signals and having output nodes for outputting respective true and complementary amplified signals;
  third and fourth inverter circuits having control nodes for receiving the respective true and complementary input signals and having mutually coupled output nodes;
  a first current source having a supply node for receiving a supply voltage, a control node coupled to the output nodes of the third and fourth inverter circuits, and an output node coupled to supply nodes of the first, second, third, and fourth inverter circuits; and
  a second current source having a reference node for receiving a reference voltage, a control node coupled to the output nodes of the third and fourth inverter circuits, and an input node coupled to reference nodes of the first, second, third, and fourth inverter circuits; and
 switching circuitry coupled to the differential amplifier for outputting true and complementary output signals in response to the true and complementary amplified signals.

8. The semiconductor substrate of claim 7 wherein the substrate comprises a semiconductor wafer.

9. A method of buffering a differential input signal, the method comprising:
 providing a differential amplifier including first, second, third and fourth inverter circuits, a first current source having a control node coupled to output nodes of the third and fourth inverter circuits and an output node coupled to supply nodes of the first, second, third, and fourth inverter circuits, and a second current source having a control node coupled to the output nodes of the third and fourth inverter circuits and an input node coupled to reference nodes of the first, second, third, and fourth inverter circuits;

applying a supply voltage to a supply node of the first current source and a reference voltage to a reference node of the second current source;

applying the differential input signal to control nodes of the inverter circuits to generate a differential amplified signal at output nodes of the first and second inverter circuits;

providing switching circuitry for receiving the differential amplified signal;

selectively outputting a differential output signal from the switching circuitry in response to the differential amplified signal.

10. The method of claim 9, further comprising deactivating the differential amplified signal in response to an inactive enable signal.

11. The method of claim 9 wherein the act of providing switching circuitry comprises providing a plurality of multiplexers.

12. The method of claim 11 wherein the act of selectively outputting the differential output signal comprises switching the multiplexers in response to the differential amplified signal.

13. The method of claim 9 wherein the act of providing the differential amplifier comprises providing a plurality of MOS transistors.

* * * * *

UNITED STATES PATENT AND TRADEMARK OFFICE
CERTIFICATE OF CORRECTION

PATENT NO.    : 6,104,209
DATED         : August 15, 2000
INVENTOR(S)   : Brent Keeth and Russel J. Baker It is certified that error appears in the above-identified patent and that said Letters Patent is hereby corrected as shown below:

<u>Title page,</u>
Item [56], References Cited, U.S. PATENT DOCUMENTS, please add
-- 5,248,946    9/1993  Murakami et al. ………….. 330/253 --
-- 5,757,711    5/1998  Nakaoka et al. ……………. 365/207 --

<u>Column 6,</u>
Lines 30-31, "complimentary input signals comprise true and complimentary input clock" should read -- complementary input signals comprise true and complementary input clock --
Lines 32-33, "and complimentary output signals comprise true and complimentary output clock" should read -- and complementary output signals comprise true and complementary output clock --

Signed and Sealed this

Twenty-seventh Day of August, 2002

Attest:

Attesting Officer

JAMES E. ROGAN
*Director of the United States Patent and Trademark Office*